US012765310B2

(12) United States Patent
Chen et al.

(10) Patent No.: US 12,765,310 B2
(45) Date of Patent: Oct. 13, 2026

(54) SYSTEMS AND METHODS FOR WAFER OVERVIEW IMAGE SCAN AND PRE-ALIGNMENT OF FILM FRAME CARRIER

(71) Applicant: KLA Corporation, Milpitas, CA (US)

(72) Inventors: Dong Chen, Singapore (SG); Chow Tian Lim, Singapore (SG); Sven Schwitalla, Marburg (DE)

(73) Assignee: KLA Corporation, Milpitas, CA (US)

( * ) Notice: Subject to any disclaimer, the term of this patent is extended or adjusted under 35 U.S.C. 154(b) by 202 days.

(21) Appl. No.: 18/888,537

(22) Filed: Sep. 18, 2024

(65) Prior Publication Data

US 2026/0026294 A1 Jan. 22, 2026

Related U.S. Application Data

(60) Provisional application No. 63/673,171, filed on Jul. 19, 2024.

(51) Int. Cl.

| | |
|---|---|
| ***G06K 9/00*** | (2022.01) |
| ***G06T 7/00*** | (2017.01) |
| ***H10P 72/00*** | (2026.01) |
| ***H10P 72/10*** | (2026.01) |

(52) U.S. Cl.

CPC ........ *H10P 72/0608* (2026.01); *G06T 7/0006* (2013.01); *H10P 72/0614* (2026.01); *H10P 72/13* (2026.01); *G06T 2207/30148* (2013.01)

(58) Field of Classification Search

CPC .................... G06T 7/0006; G06T 2207/30148

See application file for complete search history.

(56) References Cited

U.S. PATENT DOCUMENTS 10,312,124 B2 * 6/2019 Jin ........................ B25J 11/0095
2003/0159528 A1 * 8/2003 Kim ................... G01N 21/9501 73/865.8
2004/0261550 A1 * 12/2004 Asa ..................... H10P 72/0606 73/865.9

(Continued)

FOREIGN PATENT DOCUMENTS

CN 114549599 A * 5/2022 .............. H10P 72/50
EP 2523213 A2 * 11/2012 .......... H10P 72/3411

(Continued)

OTHER PUBLICATIONS

WIPO, Search Report for PCT/US2025/037481, Nov. 7, 2025.

*Primary Examiner* — Jayesh A Patel
(74) *Attorney, Agent, or Firm* — Hodgson Russ LLP

(57) ABSTRACT

The system includes a film frame carrier (FFC) configured to support a workpiece, and the FFC is removably disposed on an FFC rotator. The system further includes an end effector configured to engage the FFC to remove the FFC from the FFC rotator and a scanner disposed in a movement path of the end effector. The scanner is configured to generate an overview image of the end effector engaged with the FFC as the end effector moves away from the FFC rotator. The system further includes a processor configured to receive the overview image from the scanner, determine an alignment between the FFC and the end effector according to the overview image, and control a movement of the end effector according to the alignment between the FFC and the end effector.

20 Claims, 7 Drawing Sheets

(56) References Cited

U.S. PATENT DOCUMENTS

| | | | | |
|---|---|---|---|---|
| 2005/0012229 | A1 * | 1/2005 | Herrmann | H10P 72/50 257/797 |
| 2010/0271229 | A1 * | 10/2010 | Allen-Blanchette | H10P 72/53 340/815.4 |
| 2015/0228522 | A1 * | 8/2015 | Lin | B25J 11/0095 348/126 |
| 2020/0144097 | A1 * | 5/2020 | Thaulad | H10P 72/0608 |
| 2021/0233788 | A1 * | 7/2021 | Houng | G01N 29/04 |
| 2021/0407831 | A1 * | 12/2021 | Sunugatov | G06T 7/13 |
| 2022/0059383 | A1 * | 2/2022 | Graciano | B25J 9/1664 |
| 2023/0388523 | A1 * | 11/2023 | Sasai | H04N 19/105 |

FOREIGN PATENT DOCUMENTS

| | | | | | |
|---|---|---|---|---|---|
| KR | 20160021807 | A | * | 2/2016 | H10P 72/0611 |
| KR | 102463121 | B1 | * | 11/2022 | H01L 21/67259 |

* cited by examiner

SYSTEMS AND METHODS FOR WAFER OVERVIEW IMAGE SCAN AND PRE-ALIGNMENT OF FILM FRAME CARRIER

CROSS-REFERENCE TO RELATED APPLICATIONS

This application claims priority to the provisional patent application filed Jul. 19, 2024, and assigned U.S. App. No. 63/673,171, the disclosure of which is hereby incorporated by reference.

FIELD OF THE DISCLOSURE

This disclosure relates to semiconductor fabrication and inspection and, more particularly, to inspection of semiconductor wafers disposed on a film frame carrier during fabrication.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Some semiconductor devices are fabricated on thin wafers carried by a film frame carrier (FFC) between fabrication and inspection steps. The FFC consists of a frame that holds the wafer, which provides protection during transport. These thin wafers may include whole wafers including an array of semiconductor dies directly fabricated thereon, or reconstituted wafers (sometimes referred to as "recon" wafers) including an array of semiconductor dies disposed thereon after separate fabrication. In the process of disposing the array of semiconductor dies on the recon wafer, one or more of the dies may be misaligned relative to the other dies in the array or a die can be missing from the array. In order to determine misalignment or missing dies, the FFC may be disposed at an inspection station for a pre-scan process, which introduces additional inspection time per wafer and reduces throughput.

Between various fabrication and inspection steps, the FFC can be transported by an end effector to be disposed at different processing stations, with the accuracy of the fabrication and inspection being dependent on the alignment of the FFC disposed on each station. To pre-align the FFC during transport, the end effector may include mechanical features (e.g., pins) that engage with corresponding features of the frame (e.g., notches). However, this mechanical alignment has low accuracy, and it is not suitable for recon wafers, as their frames do not include notches. End effector pins can also be bent over time and the frame notch shape can vary, which can further introduce alignment errors. In addition, the end effector pins cannot align with an FFC that has been rotated (e.g., 90°, 180°, or 270°), which limits arrangements of the system and use cases.

Therefore, what is needed is an improved method of FFC pre-alignment and inspection of recon wafer dies.

BRIEF SUMMARY OF THE DISCLOSURE

An embodiment of the present disclosure provides a system. The system may comprise a film frame carrier (FFC) configured to support a workpiece, and an FFC rotator, the FFC being removably disposable on the FFC rotator. The system may further comprise an end effector configured to engage the FFC to remove the FFC from the FFC rotator, and a scanner disposed in a movement path of the end effector. The scanner may be configured to generate an overview image of the end effector engaged with the FFC as the end effector moves away from the FFC rotator. The system may further comprise a processor configured to receive the overview image from the scanner, determine an alignment between the FFC and the end effector according to the overview image, and control a movement of the end effector according to the alignment between the FFC and the end effector.

In some embodiments, the workpiece may comprise a reconstituted wafer having an array of dies disposed on the reconstituted wafer.

In some embodiments, the processor may be further configured to identify one or more missing dies from the array of dies according to the overview image.

In some embodiments, the processor may be further configured to determine a center position of the FFC according to the overview image.

In some embodiments, the processor may be further configured to determine an alignment between individual dies of the array of dies and control the movement of the end effector according to the alignment between the individual dies of the array of dies.

In some embodiments, the FFC may include a structural feature and the end effector may include a marking feature. The processor may be further configured to identify the structural feature and the marking feature in the overview image to determine the alignment between the FFC and the end effector.

In some embodiments, the system may further comprise a chuck configured to receive the FFC. The end effector may be configured to move the FFC from the FFC rotator to the chuck, and the scanner may be configured to generate the overview image of the end effector engaged with the FFC as the end effector moves the FFC from the FFC rotator to the chuck.

In some embodiments, the end effector may be further configured to disengage with the FFC to dispose the FFC on the chuck, and the processor may be further configured to control the movement of the end effector to align the FFC with the chuck.

In some embodiments, the system may further comprise a robot arm configured to move the end effector along the movement path to move the FFC from the FFC rotator to the chuck. The processor may be further configured to send instructions to the robot arm to control the movement of the end effector according to the alignment between the FFC and the end effector.

In some embodiments, the alignment between the FFC and the end effector may include a rotational misalignment. The processor may be configured to control the movement of the end effector to correct the rotational misalignment.

In some embodiments, the scanner may comprise a line scanner having a scan width that is greater than or equal to a width of the FFC.

In some embodiments, the scanner may be disposed in the movement path of the end effector such that a scan width is perpendicular to a movement direction of the end effector.

Another embodiment of the present disclosure provides a method. The method may comprise; engaging a film frame carrier (FFC) disposed on an FFC rotator with an end effector, wherein the FFC is configured to support a workpiece; removing the FFC from the FFC rotator with the end effector; scanning the end effector with a scanner to generate an overview image of the end effector engaged with the FFC; determining an alignment between the FFC and the end effector according to the overview image; and controlling a movement of the end effector according to the alignment between the FFC and the end effector.

In some embodiments, the FFC may include a structural feature and the end effector may include a marking feature. Determining the alignment between the FFC and the end effector according to the overview image may comprise: identifying the structural feature and the marking feature in the overview image; and determining the alignment between the FFC and the end effector according to a relative alignment between the structural feature and the marking feature.

In some embodiments, the workpiece may comprise a reconstituted wafer having an array of dies disposed on the reconstituted wafer.

In some embodiments, the method may further comprise identifying one or more missing dies from the array of dies according to the overview image.

In some embodiments, the method may further comprise determining a center position of the FFC according to the overview image.

In some embodiments, the method may further comprise determining an alignment between individual dies of the array of dies; and controlling the movement of the end effector according to the alignment between the individual dies of the array of dies.

In some embodiments, the method may further comprise moving the FFC along a movement path from the FFC rotator to a chuck with the end effector; and disengaging the end effector from the FFC to dispose the FFC on the chuck.

In some embodiments, the end effector may be scanned with the scanner while the FFC is moved along the movement path.

In some embodiments, the alignment between the FFC and the end effector may include a rotational misalignment. Controlling the movement of the end effector according to the alignment between the FFC and the end effector may comprise controlling the movement of the end effector to correct the rotational misalignment before disengaging the end effector from the FFC.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

An embodiment of the present disclosure provides a system 100. The system 100 may comprise a film frame carrier (FFC) 110. The FFC may be configured to support a workpiece 101. The workpiece 101 may be a whole wafer, diced wafer, or a reconstituted wafer having an array of dies 102 disposed thereon.

The system 100 may further comprise an FFC rotator 120. The FFC 110 may be removably disposed on the FFC rotator 120. When disposed on the FFC rotator 120, the FFC rotator 120 may be configured to rotate the FFC 110, so as to change its orientation from 0° to 360° to 360°, and any orientation therebetween. For example, the FFC rotator 120 may rotate the FFC 110 between positions of 0°, 90°, 180°, 270°, or any other position therebetween, which can be useful for different angle dark field inspection of the workpiece 101. In some embodiments, the FFC 110 may be disposed on a different component of the system 100 other than the FFC rotator 120 and is not limited herein.

Figure 1:
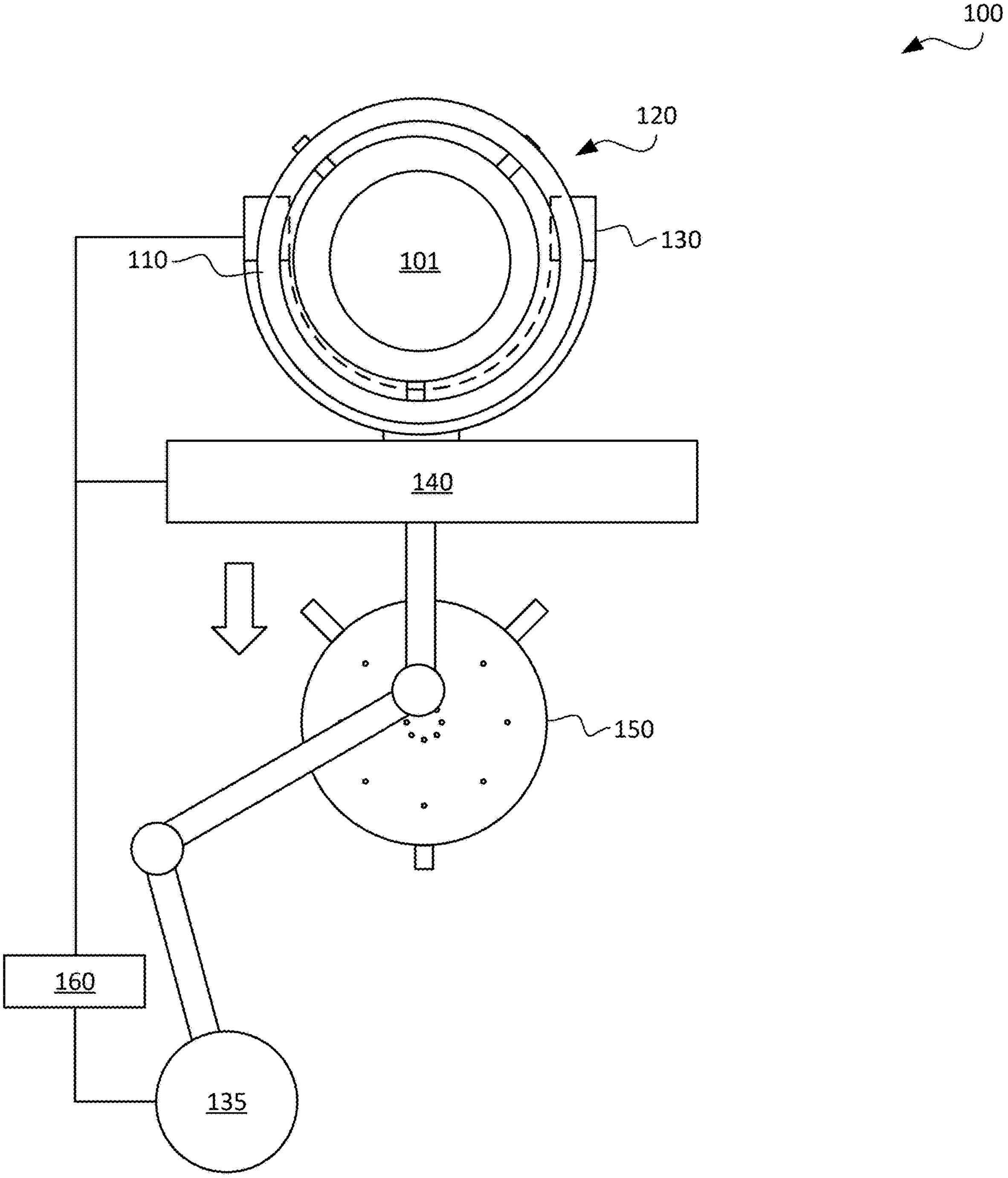
FIG. 1 is a top view of a system according to an embodiment of the present disclosure, in which the FFC is disposed on the FFC rotator.

The system 100 may further comprise an end effector 130. The end effector 130 may be configured to engage the FFC 110. For example, the end effector 130 may be configured to engage the FFC 110 to remove the FFC 110 from the FFC rotator 120, as shown in FIG. 1. In some embodiments, the end effector 130 may be configured to engage the FFC 110 using a vacuum. The end effector 130 may be connected to a robot arm 135 or other movable structure configured to move the end effector 130 along a movement path. The movement path may be defined as an extension or retraction of the robot arm 135. The movement path may be defined to minimize motions that would reduce throughput. The robot arm 135 may be configured to move the end effector 130 by actuating one or more joints of the robot arm 135 to position the end effector 130 within a volume defined by the envelope of the robot arm 135. The FFC rotator 120 may be provided within the volume. The size and shape of the envelope of the robot arm 135 may depend on the arrangement of the robot arm 135 and its degrees of freedom. Although the robot arm 135 is shown as a polar robot in FIGS. 1-3, it should be understood that the robot arm 135 may also include cartesian and cylindrical manipulators or the like and is not limited herein. The robot arm 135 may be configured to move the end effector 130 in three translational directions within the volume (i.e., x, y, and z directions). The robot arm 135 may be configured to move the end effector 130 in order to engage the end effector 130 with the FFC 110 and to remove the FFC 110 from the FFC rotator 120 and move the end effector 130 engaged with the FFC 110 along the movement path.

Figure 2:
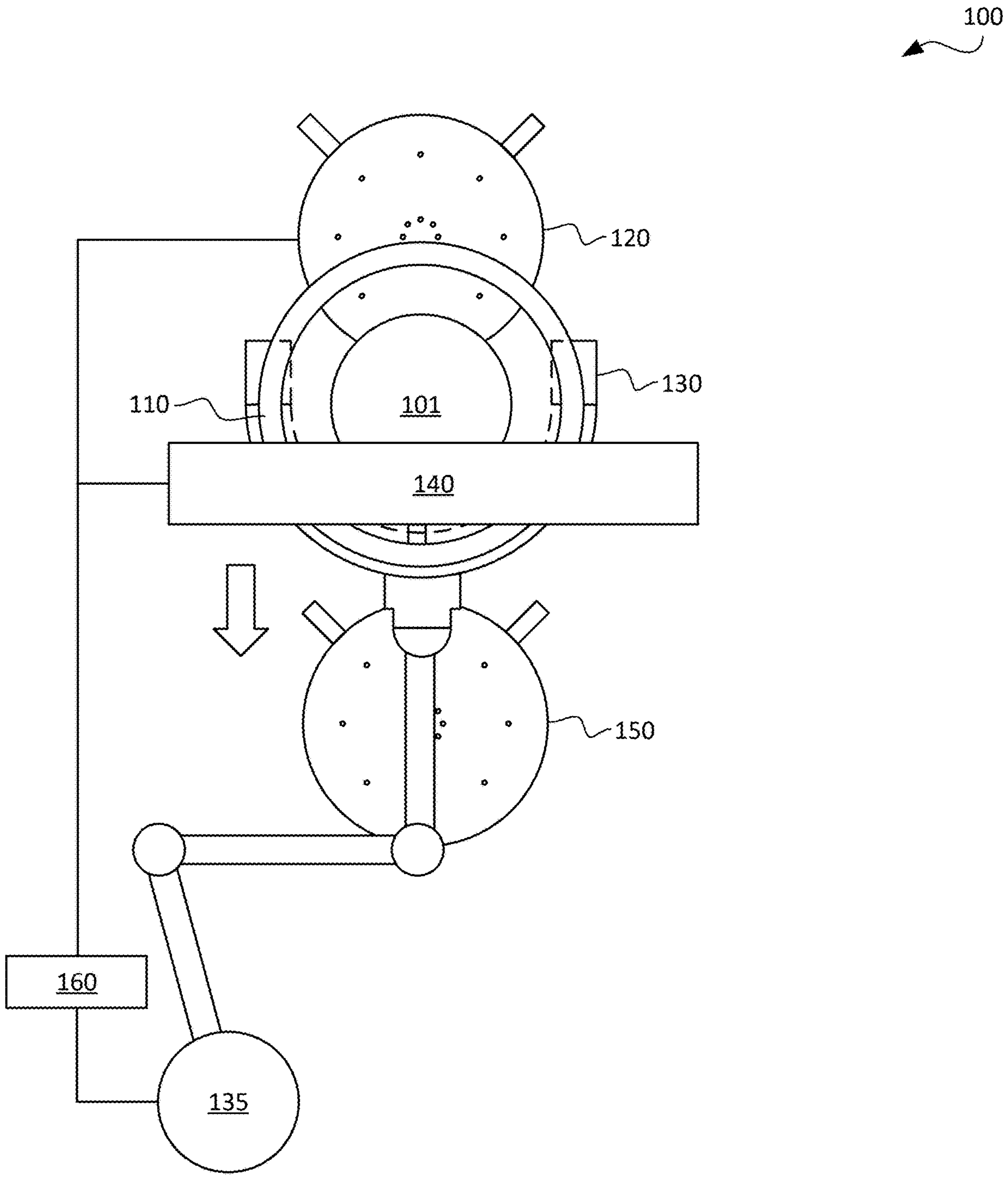
FIG. 2 is a top view of the system of FIG. 1, in which the FFC is being scanned as it is moved away from the FFC rotator by the end effector.

The system 100 may further comprise a scanner 140. The scanner 140 may be disposed in the movement path of the end effector 130. In other words, the robot arm 135 may be configured to move the end effector 130 engaged with the FFC 110 beneath the scanner 140 as it moves along the movement path. In an instance, the scanner 140 may have a resolution of less than 30 μm. In some embodiments, the scanner 140 may comprise a line scanner. The line scanner may have a scan width that is greater than or equal to a width of the FFC 110. In an instance, the scan width of the line scanner may be greater than 390 mm. Accordingly, the entire FFC 110 (which may have a width of about 380 mm) may pass beneath the scanner 140 as the end effector 130 moves along the movement path, as shown in FIG. 2. The scanner 140 may be disposed in the movement path of the end effector 130 such that the scan width is perpendicular to a movement direction of the end effector 130. The end effector 130 may move the FFC 110 in at a constant velocity and in a straight line when passed beneath the scanner 140. The scanner 140 may be configured to generate an overview image 141 of the end effector 130 engaged with the FFC 110 as the end effector 130 moves away from the FFC rotator 120 along the movement path.

Figure 3:
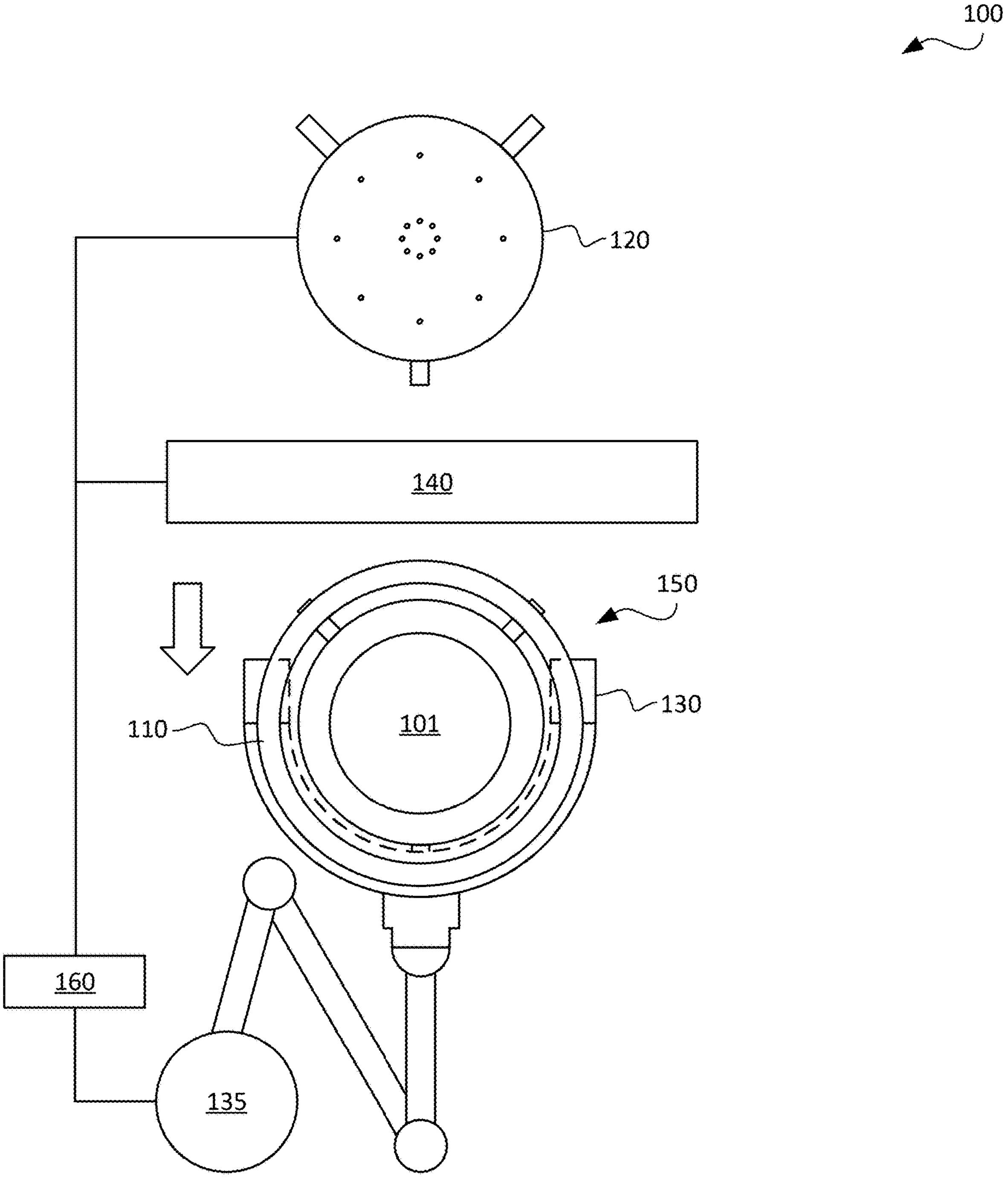
FIG. 3 is a top view of the system of FIG. 1, in which the FFC is disposed on the chuck.

The system 100 may further comprise a chuck 150. The chuck 150 may be configured to receive the FFC 110. For example, the end effector 130 may be configured to move the FFC 110 from the FFC rotator 120 to the chuck 150, as shown in FIG. 3. The movement path of the end effector 130 may depend on the specific arrangement of the elements of the system 100 to move from the FFC rotator 120 (or other component) to the chuck 150. For example, although FIG. 3 illustrates a movement path in which the robot arm 135 retracts as the end effector 130 moves from the FFC rotator 120 to the chuck 150, other movement paths in which the robot arm 135 extends or otherwise moves are possible. The scanner 140 may be configured to generate the overview image 141 of the end effector 130 engaged with the FFC 110 as the end effector 130 moves the FFC 110 from the FFC rotator 120 to the chuck 150. Accordingly, throughput impact can be reduced, since no extra movement of the end effector 130 may be needed to be scanned by the scanner 140 on the way to the chuck 150. The end effector 130 may be configured to disengage from the FFC 110 to dispose the FFC 110 on the chuck 150. When disposed on the chuck 150, one or more fabrication or inspection processes can be performed on the workpiece 101 carried by the FFC 110. The chuck 150 may be configured to hold the FFC 110 to prevent movement during inspection or processing.

The system 100 may further comprise a processor 160. The processor 160 may include a microprocessor, a micro-controller, or other devices. The processor 160 may be coupled to the components of the system 100 in any suitable manner (e.g., via one or more transmission media, which may include wired and/or wireless transmission media) such that the processor 160 can receive output. The processor 160 may be configured to perform a number of functions using the output. An inspection tool can receive instructions or other information from the processor 160. The processor 160 optionally may be in electronic communication with another inspection tool, a metrology tool, a repair tool, or a review tool (not illustrated) to receive additional information or send instructions.

The processor 160 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 160 may be disposed in or otherwise part of the system 100 or another device. In an example, the processor 160 may be part of a standalone control unit or in a centralized quality control unit. Multiple processors 160 may be used, defining multiple subsystems of the system 100.

The processor 160 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 160 to implement various methods and functions may be stored in readable storage media, such as a memory.

If the system 100 includes more than one subsystem, then the different processors 160 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 160 may be configured to perform a number of functions using the output of the system 100 or other output. For instance, the processor 160 may be configured to send the output to an electronic data storage unit or another storage medium. The processor 160 may be further configured as described herein.

The processor 160 may be configured according to any of the embodiments described herein. The processor 160 also may be configured to perform other functions or additional steps using the output of the system 100 or using images or data from other sources.

The processor 160 may be communicatively coupled to any of the various components or sub-systems of system 100 in any manner known in the art. Moreover, the processor 160 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 160 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random-access memory, a magnetic or optical disk, a non-volatile memory, a solid-state memory, a magnetic tape, and the like. A carrier medium may include a transmission medium such as a wire, cable, or wireless transmission link. For instance, the various steps described throughout the present disclosure may be carried out by a single processor 160 (or computer subsystem) or, alternatively, multiple processors 160 (or multiple computer subsystems). Moreover, different sub-systems of the system 100 may include one or more computing or logic systems. Therefore, the above description should not be interpreted as a limitation on the present disclosure but merely an illustration.

The processor 160 may be in electronic communication with the FFC rotator 120. For example, the processor 160 may be configured to send instructions to the FFC rotator 120 to rotate the FFC 110 a particular angular position (e.g., 0°, 90°, 180°, 270°, or any other position therebetween). For example, for an inspection process using dark field illumination, detection of defects may depend on the angle of illumination and the polarization of the light. Thus, the FFC 110 can be rotated by the FFC rotator 120 to a particular angular position suitable for detection of defects.

The processor 160 may be in electronic communication with the robot arm 135. For example, the processor 160 may be configured to send instructions to the robot arm 135 to move the end effector 130 to engage the FFC 110 disposed on the FFC rotator 120. The processor 160 may be further configured to send instructions to the robot arm 135 to move the end effector 130 engaged with the FFC 110 along a movement path that passes across the scanner 140 as it moves away from the FFC rotator 120 to the chuck 150. The processor 160 may be further configured to send instructions to the robot arm 135 to disengage the end effector 130 from the FFC 110 to dispose the FFC 110 on the chuck 150.

The processor 160 may be in electronic communication with the scanner 140. For example, the processor 160 may be configured to receive the overview image 141 from the scanner 140. The processor 160 may be further configured to determine an alignment between the FFC 110 and the end effector 130 according to the overview image 141. The processor 160 may be further configured to control a movement of the end effector 130 according to the alignment between the FFC 110 and the end effector 130. For example, the processor 160 may be configured to send instructions to the robot arm 135 to correct or compensate for a translational or rotational misalignment between the FFC 110 and the end effector 130, to control the movement of the end effector 130 to align the FFC 110 with the chuck 150. In some embodiments, the alignment between the FFC 110 and the end effector 130 may include a rotational misalignment. Accordingly, the processor 160 may be configured to control the movement of the end effector 130 to correct the rotational misalignment when the FFC 110 is disposed on the chuck 150. In some embodiments, the alignment between the FFC 110 and the end effector 130 may include a translational misalignment. Accordingly, the processor 160 may be configured to control the movement of the end effector 130 to correct the translational misalignment when the FFC 110 is disposed on the chuck 150.

Figure 4:
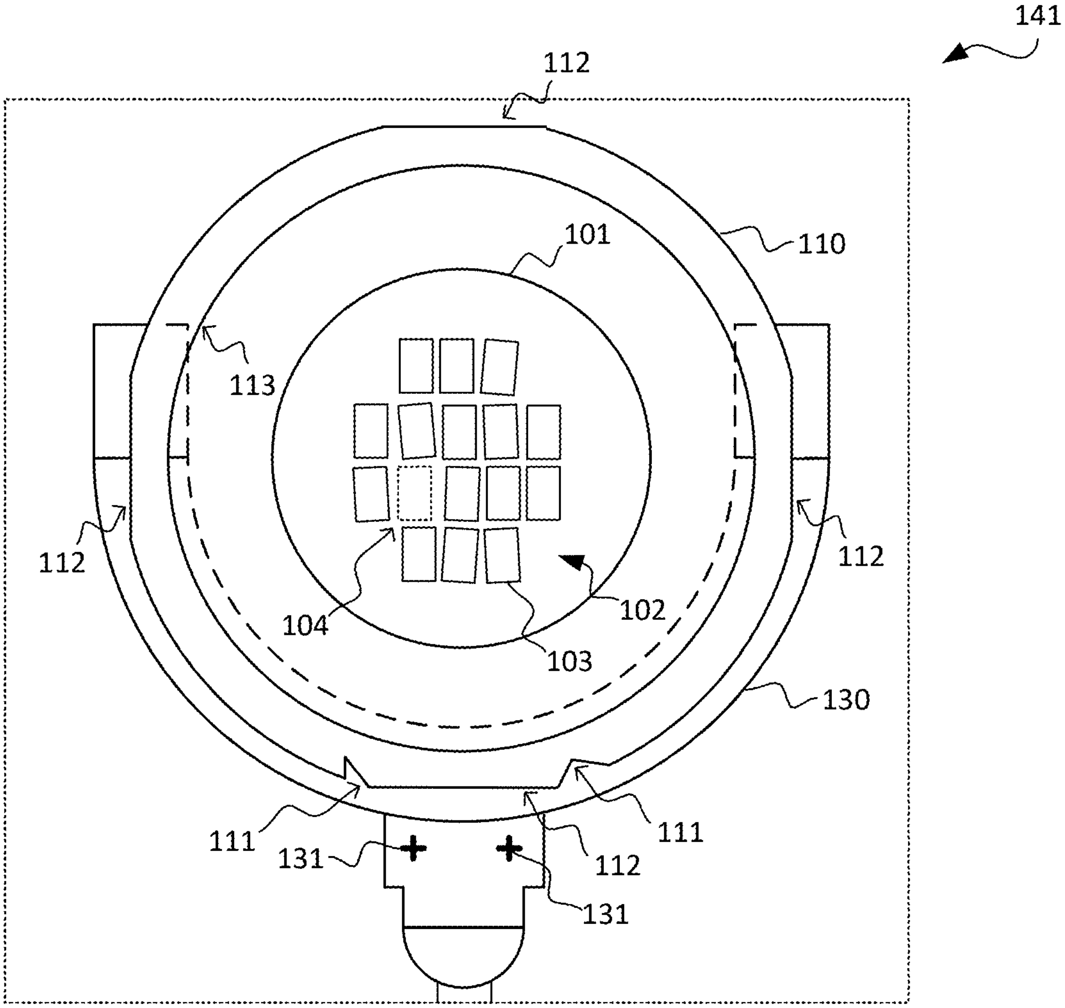
FIG. 4 is an exemplary overview image captured by the scanner of the system of FIG. 1.

FIG. 4 illustrates an exemplary overview image 141 generated by the scanner 140. The processor 160 may be configured to determine the alignment between the FFC 110 and the end effector 130 by identifying one or more features in the overview image 141. For example, the processor 160 may be configured to identify a structural feature of the FFC 110 in the overview image 141. The structural feature may include a notch 111, flat 112, curve 113, or other feature on the frame of the FFC 110 having identifiable edges. The processor 160 may be configured to identify a marking feature of the end effector 130 in the overview image 141. The marking feature may be etched, printed, or disposed on the end effector 130, or the marking feature may be an integrally formed feature of the end effector 130. In some embodiments, the marking feature may include a cross-shaped feature 131, a bow tie feature, or any other feature on the end effector 130. The cross-shaped feature 131 may be aligned with the X and Y directions of the robot arm 135.

The processor 160 may be configured to compare the orientation of the structural feature of the FFC 110 to the orientation of the marking feature of the end effector 130. In some embodiments, an edge of a flat 112 or a notch 111 of the FFC 110 can be compared to a line of the cross-shaped feature 131 that is aligned with the X direction, and another edge of a flat 112 or notch 111 of the FFC 110 can be compared to another line of the cross-shaped feature 131 that is aligned with the X direction. Based on the relative alignment between the edges of the structural features and the lines of the marking features, the alignment (i.e., translational and/or rotational) between the end effector 130 and the FFC 110 can be determined.

The workpiece 101 including the array of dies 102 can be seen in the overview image 141, as shown in FIG. 4. The array of dies 102 disposed on the reconstituted wafer may be arranged in a rectangular array with regular spacing between adjacent dies 103. The processor 160 may be configured to identify where there is a spacing between two of more dies 103 that is greater than the regular spacing, which may indicate a location of a missing die 104. Upon identification of a missing die 104, the processor 160 may be configured to send instructions to reject the wafer from further processing, correct the wafer (e.g., dispose a die in the place of the missing die), or modify the processing of the wafer (e.g., not perform further fabrication steps in the place of the missing die).

The processor 160 may be further configured to determine a center position of the FFC 110 according to the overview image 141. For example, the processor 160 may perform curve fitting on a curve 113 of the FFC 110, which can be used to identify the center position of the FFC 110. For whole wafers, the center position of the wafer can be determined by curve fitting of an edge of the wafer and a notch 111 of the FFC 110. The center position of the FFC 110 can be used to define the origin of the coordinate system used for fabrication and inspection processes on the chuck 150. With the center position of the FFC 110, the arrangement of the individual dies 103 of the array of dies 102 can be determined based on a rectangular grid within the coordinate system. The processor 160 may be further configured to send instructions to the robot arm 135 to control the movement of the end effector 130 such that the center position of the FFC 110 is aligned with a center of the chuck 150 when the FFC 110 is disposed on the chuck 150.

The processor 160 may be further configured to determine an alignment between individual dies 103 of the array of dies 102 according to the overview image 141. When each individual die 103 is disposed on the reconstituted wafer, there may be differences in the translational and rotational alignment compared to the regular spacing and arrangement of the adjacent dies 103. For example, based on the rectangular grid defined by the coordinate system of the FFC 110, the rotation and translation error of each individual die 103 can be calculated. Based on the alignment between individual dies 103, the processor 160 may be configured to send instructions to reject the wafer from further processing or modify the processing of the wafer. For example, the processor 160 may be configured to send instructions to the robot arm 135 to control the movement of the end effector 130 according to the alignment between the individual dies 103 of the array of dies 102. The movement of the end effector 130 can be controlled to correct or compensate for the translational or rotational alignment of the individual dies 103 of the array of dies 102. For example, the alignment of the FFC 110 can be adjusted such that alignment of one or more of the individual dies 103 that was found to be misaligned is corrected. It should be understood that the movement correction of the end effector 130 is a global adjustment, which may not compensate for each individual alignment. However, the corrective movement may be determined so as to align most of the individual dies 103 of the array of dies 102 or minimize the misalignment of the individual dies 103. Accordingly, the FFC 110 can be pre-aligned before being disposed on the chuck 150 for further fabrication or inspection processing.

With the system 100, the alignment of the FFC 110 and the end effector 130 can be determined with higher accuracy compared to mechanical methods (e.g., less 100 μm error). This can also be applicable to various workpieces 101, including whole wafers, diced wafers, and reconstituted wafers, carried by an FFC 110 at various orientations. Since the scanning process is performed as the FFC 110 is moved from the FFC rotator 120 to the chuck 150, the pre-alignment can be performed dynamically, and throughput time can be reduced. In addition, since the overview image 141 encompasses the entire FFC 110 and end effector 130, additional information such as the center position of the FFC 110, missing dies 104 of the array of dies 102, and/or alignment of individual dies 103 can be determined, which can eliminate separate inspection processes and further reduce throughput time.

Figure 5:
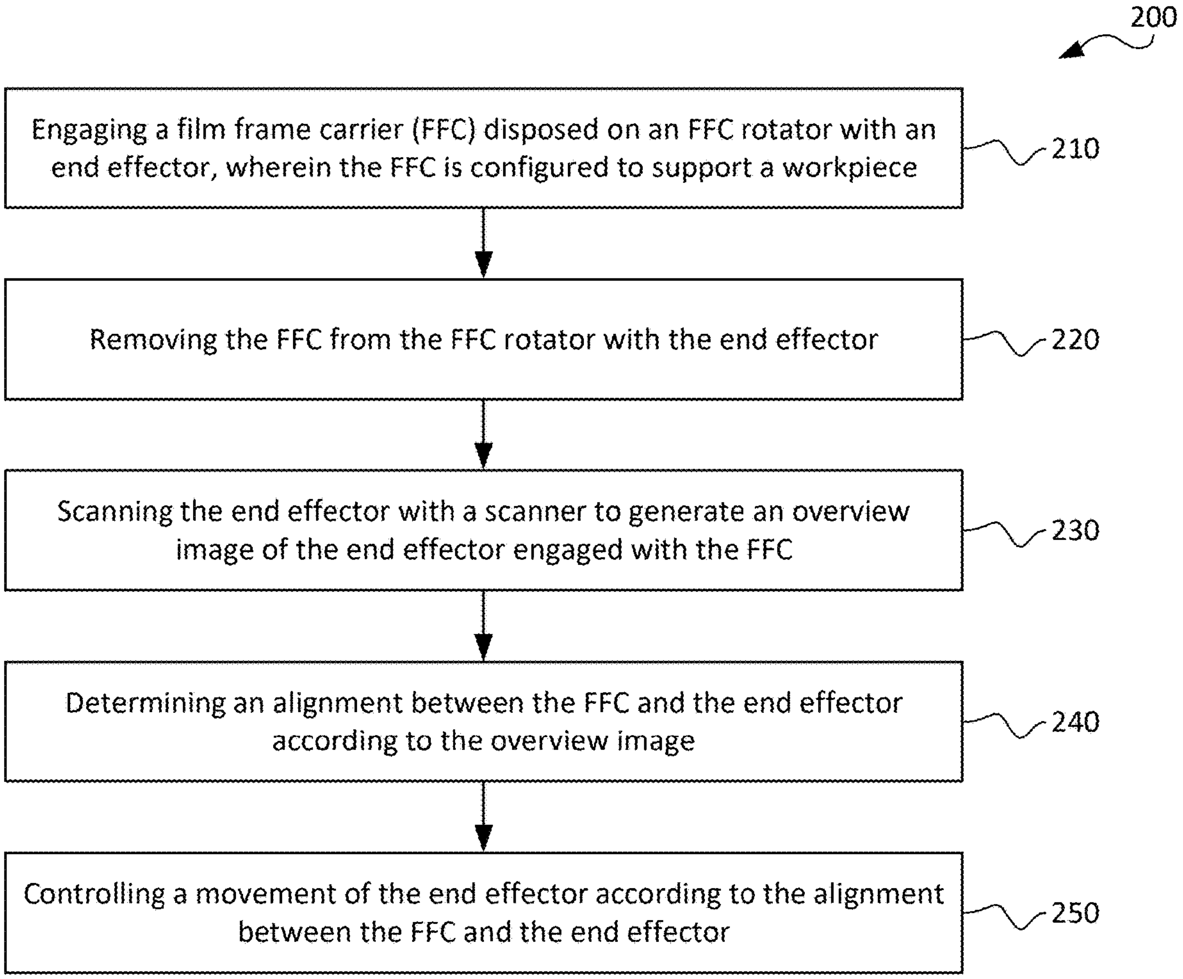
FIG. 5 is a flowchart of a method according to an embodiment of the present disclosure.

Another embodiment of the present disclosure provides a method 200. As shown in FIG. 5, the method 200 may comprise the following steps.

At step 210, an FFC disposed on an FFC rotator is engaged with an end effector. The FFC may be configured to support a workpiece. In some embodiments, the workpiece may comprise a reconstituted wafer having an array of dies disposed on the reconstituted wafer.

At step 220, the FFC is removed from the FFC rotator with the end effector.

At step 230, the end effector is scanned with a scanner to generate an overview image of the end effector engaged with the FFC.

At step 240, an alignment between the FFC and the end effector is determined according to the overview image. The alignment between the FFC and the end effector may include translational alignment (e.g., X and Y directions) and rotational alignment (e.g., rotation about Z axis).

At step 250, a movement of the end effector is controlled according to the alignment between the FFC and the end effector. For example, the movement of the end effector may be adjusted to compensate for or correct a misalignment (e.g., translational or rotational) between the end effector and the FFC. Accordingly, pre-alignment of the FFC can be achieved during movement, without reducing throughput.

Figure 6:
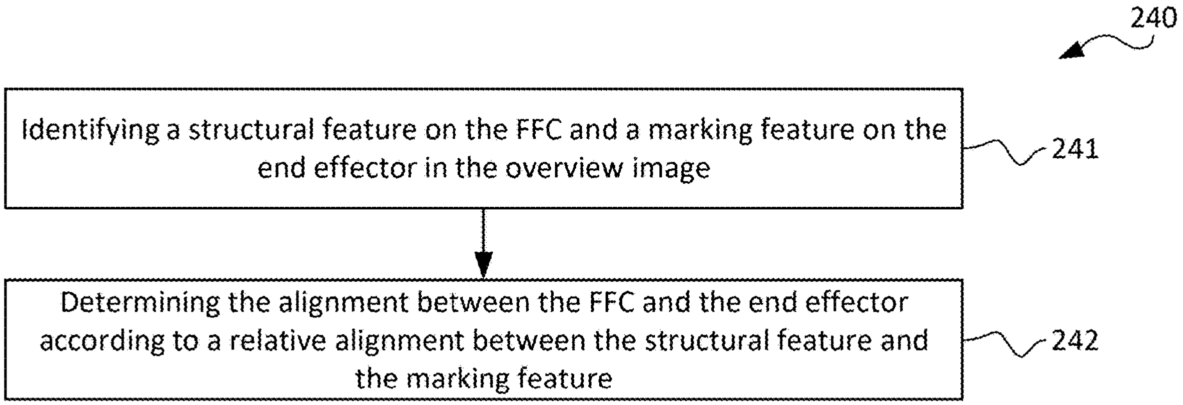
FIG. 6 is a flowchart of a method according to another embodiment of the present disclosure.

In some embodiments, step 240 may comprise the following steps shown in FIG. 6.

At step 241, a structural feature on the FFC and a marking feature on the end effector are identified in the overview image. The structural feature may be a notch, flat, or other feature on the frame of the FFC having identifiable edges. The marking feature may be etched, printed, or disposed on the end effector. Alternatively, the marking feature may be an integrally formed feature of the end effector. In some embodiments, the marking feature may be a cross-shaped feature. The cross-shaped feature may be aligned with X and Y directions of the movement system.

At step 242, the alignment between the FFC and the end effector is determined according to a relative alignment between the structural feature and the marking feature. For example, the orientation of the structural feature of the FFC can be compared to the orientation of the marking feature of the end effector. In some embodiments, an edge of a flat feature or a notch of the FFC can be compared to a line of the marking feature that is aligned with the X direction, and another edge of a flat feature or notch of the FFC can be compared to another line of the marking feature that is aligned with the X direction. Based on the relative alignment between the edges of the structural features and the lines of the marking feature, the alignment (i.e., translational and/or rotational) between the end effector and the FFC can be determined.

Figure 7:
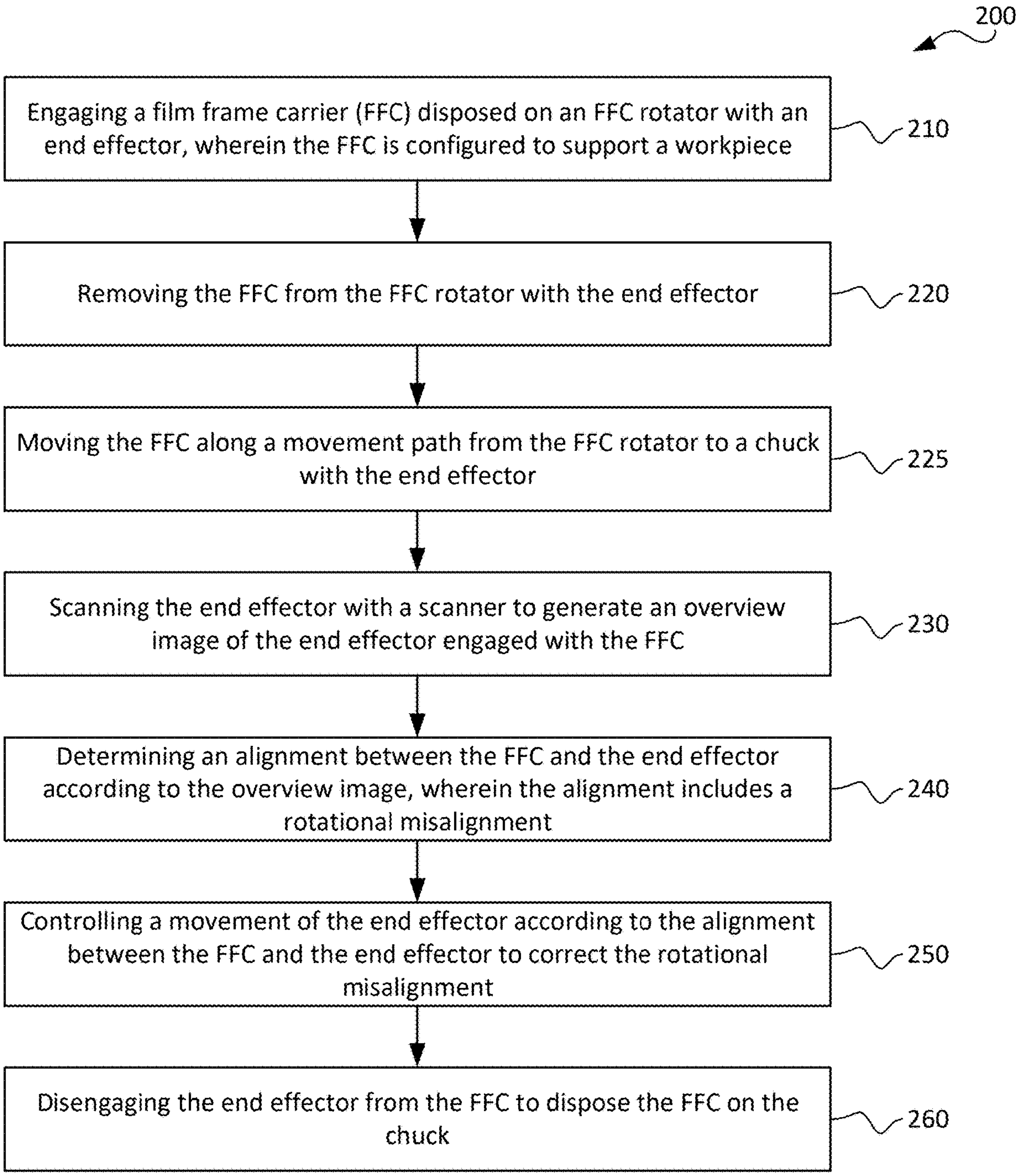
FIG. 7 is a flowchart of a method according to another embodiment of the present disclosure.

In some embodiments, after step 220, the method 200 may comprise step 225, shown in FIG. 7. At step 225, the FFC is moved along a movement path with the end effector from the FFC rotator to a chuck. The shape of the movement path may depend upon the arrangement of the elements of the system. In some embodiments, the movement path may be defined by an extension or a retraction of the end effector. Although step 230 is shown following step 225, it should be understood that the end effector may be scanned in step 230 while the end effector moves along the movement path in step 225. In other words, the movement path may be defined such that the end effector engaged with the FFC passes by the scanner in order to generate the overview image.

In some embodiments, after step 250, the method 200 may comprise step 260, also shown in FIG. 7. At step 260, the end effector is disengaged from the FFC to dispose the FFC on the chuck. In particular, in step 250, the movement of the end effector is controlled in order to correct or compensate for any misalignment between the end effector and the FFC, such that the FFC is aligned when disposed on the chuck in step 260.

Figure 8:
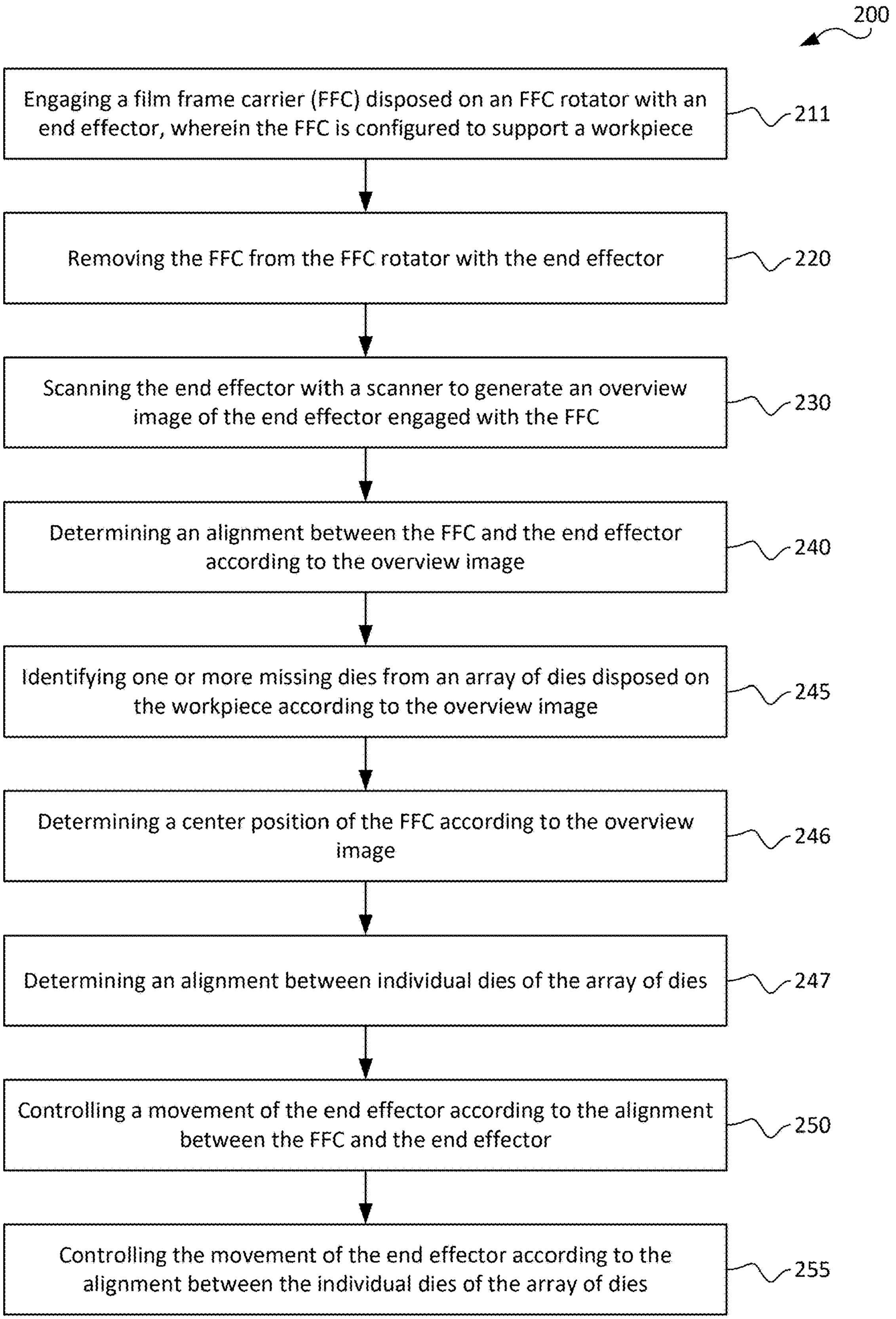
FIG. 8 is a flowchart of a method according to another embodiment of the present disclosure.

In some embodiments, the workpiece may comprise a reconstituted wafer having an array of dies disposed on the reconstituted wafer. Accordingly, the method 200 may further comprise the following steps shown in FIG. 8.

At step 245, one or more missing dies are identified from the overview image. For example, the array of dies disposed on the reconstituted wafer may be arranged in a rectangular array with regular spacing between adjacent dies. Where there is a spacing between two of more dies that is greater than the regular spacing, this may indicate a location of a missing die. This information may be used to reject the wafer from further processing, correct the wafer (e.g., dispose a die in the place of the missing die), or modify the processing of the wafer (e.g., not perform further fabrication steps in the place of the missing die).

At step 246, a center position of the FFC is determined according to the overview image. The center position of the FFC can be compared to the center of the array of dies for alignment of fabrication and inspection processes.

At step 247, an alignment between individual dies of the array of dies is determined. When each individual die is disposed on the reconstituted wafer, there may be differences in the translational and rotational alignment compared to the regular spacing and arrangement of the adjacent dies. This information may be used to reject the wafer from further processing or modify the processing of the wafer, as further described below.

At step 255, the movement of the end effector is controlled according to the alignment between the individual dies of the array of dies. The movement of the end effector can be controlled to correct or compensate for the translational or rotational alignment of the individual dies of the array of dies. For example, the alignment of the FFC can be adjusted such that alignment of one or more of the individual dies that was found to be misaligned is corrected. It should be understood that the movement correction of the end effector is a global adjustment, which may not compensate for each individual alignment. However, the corrective movement may be determined so as to align most of the individual dies of the array of dies or minimize the misalignment of the individual dies. Accordingly, after steps 250 and 255, the FFC can be pre-aligned before being disposed on the chuck in step 260 for further fabrication or inspection processing.

With the method 200, the alignment of the FFC and the end effector can be determined with higher accuracy compared to mechanical methods (e.g., less 100 μm error). The method 200 can also be applicable to various workpieces, including whole wafers, diced wafers, and reconstituted wafers, carried by an FFC at various orientations. Since the scanning process is performed as the FFC is moved from the FFC rotator to the chuck, the pre-alignment can be performed dynamically, and throughput time can be reduced. In addition, since the overview image encompasses the entire FFC and end effector, additional information such as the center position of the FFC, missing dies of the array of dies, and/or alignment of individual dies can be determined, which can eliminate separate inspection processes and further reduce throughput time.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
- a film frame carrier (FFC) configured to support a workpiece;
- an FFC rotator, wherein the FFC is removably disposable on the FFC rotator;
- an end effector configured to engage the FFC to remove the FFC from the FFC rotator;
- a scanner disposed in a movement path of the end effector and configured to generate an overview image of the end effector engaged with the FFC as the end effector moves away from the FFC rotator; and
- a processor configured to:
  - receive the overview image from the scanner;
  - determine an alignment between the FFC and the end effector according to the overview image; and
  - control a movement of the end effector according to the alignment between the FFC and the end effector.

2. The system of claim 1, wherein the workpiece comprises a reconstituted wafer having an array of dies disposed on the reconstituted wafer.

3. The system of claim 2, wherein the processor is further configured to identify one or more missing dies from the array of dies according to the overview image.

4. The system of claim 2, wherein the processor is further configured to determine a center position of the FFC according to the overview image.

5. The system of claim 2, wherein the processor is further configured to:
- determine an alignment between individual dies of the array of dies; and
- control the movement of the end effector according to the alignment between the individual dies of the array of dies.

6. The system of claim 1, wherein the FFC includes a structural feature and the end effector includes a marking feature, and the processor is further configured to identify the structural feature and the marking feature in the overview image to determine the alignment between the FFC and the end effector.

7. The system of claim 1, further comprising:
- a chuck configured to receive the FFC, wherein the end effector is configured to move the FFC from the FFC rotator to the chuck, and the scanner is configured to generate the overview image of the end effector engaged with the FFC as the end effector moves the FFC from the FFC rotator to the chuck.

8. The system of claim 7, wherein the end effector is further configured to disengage with the FFC to dispose the FFC on the chuck, and the processor is further configured to control the movement of the end effector to align the FFC with the chuck.

9. The system of claim 7, further comprising:
- a robot arm configured to move the end effector along the movement path to move the FFC from the FFC rotator to the chuck, wherein the processor is further configured to send instructions to the robot arm to control the movement of the end effector according to the alignment between the FFC and the end effector.

10. The system of claim 1, wherein the alignment between the FFC and the end effector includes a rotational misalignment, and the processor is configured to control the movement of the end effector to correct the rotational misalignment.

11. The system of claim 1, wherein the scanner comprises a line scanner having a scan width that is greater than or equal to a width of the FFC.

12. The system of claim 11, wherein the scanner is disposed in the movement path of the end effector such that a scan width is perpendicular to a movement direction of the end effector.

13. A method comprising:
- engaging a film frame carrier (FFC) disposed on an FFC rotator with an end effector, wherein the FFC is configured to support a workpiece;
- removing the FFC from the FFC rotator with the end effector;

scanning the end effector with a scanner to generate an overview image of the end effector engaged with the FFC;

determining an alignment between the FFC and the end effector according to the overview image; and controlling a movement of the end effector according to the alignment between the FFC and the end effector.

14. The method of claim 13, wherein the FFC includes a structural feature, the end effector includes a marking feature, and determining the alignment between the FFC and the end effector according to the overview image comprises:

identifying the structural feature and the marking feature in the overview image; and determining the alignment between the FFC and the end effector according to a relative alignment between the structural feature and the marking feature.

15. The method of claim 13, wherein the workpiece comprises a reconstituted wafer having an array of dies disposed on the reconstituted wafer, and the method further comprises:

identifying one or more missing dies from the array of dies according to the overview image.

16. The method of claim 13, wherein the workpiece comprises a reconstituted wafer having an array of dies disposed on the reconstituted wafer, and the method further comprises:

determining a center position of the FFC according to the overview image.

17. The method of claim 13, wherein the workpiece comprises a reconstituted wafer having an array of dies disposed on the reconstituted wafer, and the method further comprises:

determining an alignment between individual dies of the array of dies; and controlling the movement of the end effector according to the alignment between the individual dies of the array of dies.

18. The method of claim 13, further comprising:

moving the FFC along a movement path from the FFC rotator to a chuck with the end effector; and disengaging the end effector from the FFC to dispose the FFC on the chuck.

19. The method of claim 18, wherein the end effector is scanned with the scanner while the FFC is moved along the movement path.

20. The method of claim 18, wherein the alignment between the FFC and the end effector includes a rotational misalignment, and controlling the movement of the end effector according to the alignment between the FFC and the end effector comprises:

controlling the movement of the end effector to correct the rotational misalignment before disengaging the end effector from the FFC.

* * * * *